United States Patent
Werner et al.

(10) Patent No.: US 7,997,921 B1
(45) Date of Patent: Aug. 16, 2011

(54) CONNECTING ELEMENTS HAVING A STUB SURROUNDED BY A HOLLOW STALK WITH A FLANGE

(75) Inventors: Walter V. Werner, Pittsford, NY (US); Earl W. Stromberg, Roanoke, TX (US); Wit Cezary Bushko, Medway, MA (US); George Hanna Ghanime, Ballston Spa, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/905,665

(22) Filed: Oct. 15, 2010

(51) Int. Cl.
*H01R 13/627* (2006.01)

(52) U.S. Cl. .......................................... 439/352

(58) Field of Classification Search ................ 439/352, 439/350, 353, 354, 355, 357, 78, 66
See application file for complete search history.

(56) References Cited

U.S. PATENT DOCUMENTS

| | | | |
|---|---|---|---|
| 3,314,044 | A | 4/1967 | Powell |
| 3,526,867 | A | 9/1970 | Keeler, II |
| 4,603,927 | A | 8/1986 | Gardner |
| RE33,005 | E | 8/1989 | Bryce |
| 5,181,632 | A * | 1/1993 | Latter ...................... 222/153.06 |
| 5,299,939 | A | 4/1994 | Walker et al. |
| 5,774,341 | A | 6/1998 | Urbish et al. |
| RE36,442 | E | 12/1999 | Kardos |
| 6,033,250 | A * | 3/2000 | Pauza ............................ 439/357 |
| 6,146,151 | A | 11/2000 | Li |
| 6,319,052 | B1 * | 11/2001 | Chang ............................ 439/495 |
| 6,655,978 | B2 * | 12/2003 | Lutsch et al. ................. 439/352 |
| 6,932,618 | B1 | 8/2005 | Nelson |
| 7,014,473 | B2 | 3/2006 | Millard et al. |
| 7,323,787 | B2 | 1/2008 | Chan |
| 7,325,302 | B2 | 2/2008 | Mathieu et al. |
| 7,382,142 | B2 | 6/2008 | Chong et al. |
| 7,393,214 | B2 | 7/2008 | DiStefano |
| 7,491,069 | B1 | 2/2009 | Di Stefano et al. |
| 7,500,866 | B2 * | 3/2009 | Gennai et al. ................. 439/367 |
| 7,559,700 | B2 | 7/2009 | Eguchi et al. |
| 7,559,770 | B2 | 7/2009 | Di Stefano |
| 7,579,848 | B2 | 8/2009 | Bottoms et al. |

(Continued)

OTHER PUBLICATIONS

"3M Dual Lock Reclosable Fasteners", 3M, Industrial Business Industrial Adhesives and Tapes Division, St. Paul, MN—55144-1000, Aug. 2005, pp. 1-6.

(Continued)

*Primary Examiner* — Chandrika Prasad
(74) *Attorney, Agent, or Firm* — Howard IP Law Group, PC

(57) ABSTRACT

A plurality of connecting elements projects from a surface of an article. Each connecting element includes a first stalk and second hollow stalk projecting from the surface. The second stalk is generally coaxial with the first stalk and spaced apart from the first stalk defining a radial gap therebetween. The first stalk includes a cap section. The second stalk includes a stem projecting generally orthogonally, at a proximal end thereof, from the surface. A flange section having a first wall thickness extends from a distal end of the stem and has an outer diameter greater than an outer diameter of the stem at the distal end. An engagement section extends from the flange section. A free end of the engagement section having a second wall thickness defines a distal end of the second stalk and has an outer diameter less than the outer diameter of the flange section.

21 Claims, 11 Drawing Sheets

U.S. PATENT DOCUMENTS

| | | |
|---|---|---|
| 7,837,476 B2 | 11/2010 | Di Stefano |
| 2010/0022105 A1 | 1/2010 | Di Stefano |
| 2010/0075547 A1 | 3/2010 | Lin et al. |
| 2010/0105220 A1 | 4/2010 | Di Stefano |
| 2010/0159753 A1 | 6/2010 | Hsu et al. |
| 2010/0273364 A1 | 10/2010 | Di Stefano |

OTHER PUBLICATIONS

Commonly owned, co-pending U.S. Appl. No. 12/881,379, filed Sep. 14, 2010; specification (as filed) and formal drawings.

Commonly owned, co-pending U.S. Appl. No. 12/917,118, filed Nov. 1, 2010; specification and drawings (as filed).

* cited by examiner

CONNECTING ELEMENTS HAVING A STUB SURROUNDED BY A HOLLOW STALK WITH A FLANGE

FIELD OF INVENTION

The present invention relates generally to interconnect systems, and more particularly, to high density interconnect systems.

BACKGROUND

Fasteners, solders and adhesives have been used to attach components to primary hardware and structures to establish an electrical connection therebetween. For example, integrated circuit (IC) chips are typically soldered to motherboards. However, solders are subject to problems such as cracking which may cause a circuit board to malfunction or to fail. Furthermore, solders conventionally include lead, which may be undesirable in some applications. Adhesives used to connect a component to a primary hardware often require a long cure time. Further, adhesives often employ undesirable solvents for attachment. Moreover, once the component is attached to a structure using solder or adhesive, the component may not be repositioned without damaging the component and/or the structure.

Other options include coating the surface of mechanical interconnects with an electrically conductive material. Several of the known mechanical interconnect systems include hook and loop fasteners available under the trademark Velcro® from Velcro USA, Inc., Manchester, N.H. and reclosable fasteners available under the trademark 3M™ Dual Lok™ from 3M, St. Paul, Minneapolis. However, such mechanical fasteners suffer from disadvantages such as unpredictable contact area, which may prove detrimental to consistent high electrical conductivity, and insufficient locking strength. These fasteners are also subject to frictional locking which may deform the fasteners upon multiple engagement/disengagement cycles. Such fasteners provide rather limited holding force that rapidly decreases with repeated cycles of engagement and disengagement. Alternatives are, therefore, desirable.

SUMMARY

According to an embodiment of the invention, an article of manufacture includes a plurality of regularly spaced connecting elements projecting from a surface thereof for interconnecting with a corresponding body having a corresponding plurality of regularly spaced connecting elements. Each one of the plurality of connecting elements includes a first stub and a second hollow stalk projecting generally orthogonally from the surface and surrounding the first stub. The second hollow stalk is generally coaxial with the first stalk and is spaced apart from the first stalk defining a radial gap therebetween. The first stub includes a cap section. The second stalk includes a stem projecting generally orthogonally, at a proximal end thereof, from the surface. A flange section extends from a distal end of the stem. The flange section has an outer diameter greater than the outer diameter of the stem at the distal end. An engagement section extends from the flange section. A free end of the engagement section defines a distal end of the second stalk. The free end of the engagement section has an outer diameter less than the outer diameter of the flange section. The first stub extends axially beyond the second stalk such that the base of the cap section is at least as distant from the surface as the free end of the second stalk. The outer surface of the cap section may be generally conical, or generally hemispherical, or may have a generally convex contour.

According to an embodiment of the invention, the wall thickness of the engagement section decreases continuously from the flange section to the free end thereof. The wall thickness of the flange section decreases continuously from the flange section to the distal end of the stem.

According to another embodiment of the invention, a system includes a first interconnecting body having a first plurality of regularly spaced connecting elements projecting from a first surface of thereof and a second interconnecting body configured for connecting with the first interconnecting article and having a second plurality of regularly spaced connecting elements projecting from a second surface thereof. Each one of the first and second pluralities of connecting elements is uniformly dimensioned and includes a first stub and a second hollow stalk projecting generally orthogonally from one of the first and second surfaces of the first and second bodies. The second hollow stalk surrounds the first stub, is generally coaxial with the first stub and spaced apart from the first stalk defining a radial gap therebetween. The first stub includes a cap section. The second stalk includes a stem projecting generally orthogonally, at a proximal end thereof, from the one of the first and second surfaces. A flange section extends from a distal end of the stem. The flange section has an outer diameter greater than an outer diameter of the stem at the distal end. An engagement section extends from the flange section. A free end of the engagement section defines a distal end of the second stalk. The free end of the engagement section has an outer diameter less than the outer diameter of the flange section. The first stub extends axially beyond the second stalk such that the base of the cap section is at least as distant from the surface as the free end of the second stalk. The outer surface of the cap section may be generally conical, or generally hemispherical, or may have a generally convex contour.

The second body is configured to be superposed on the first body such that the cap sections of the second plurality of connecting elements are in general contact engagement with the cap sections of the first plurality of connecting elements. At least one sub-set of connecting elements of the first plurality of connecting elements defines a central gap for accommodating a corresponding connecting element of the second plurality of connecting elements upon application of a first force in excess of a first predetermined threshold on at least one of the first and second bodies urging at least one of the first and second bodies toward one another.

Applying a second force in excess of a second predetermined threshold on at least one of the first and second bodies in a direction opposite of the first force pulling the first and second bodies away from each other causes the connecting element of the second plurality of connecting elements to be released from the at least one sub-set of the connecting elements of the first plurality of connecting elements.

According to an embodiment of the invention, an electrical interconnect apparatus includes a substrate and a plurality of regularly spaced connecting elements projecting from the substrate. Each of the plurality of connecting elements includes a first stub and a second hollow stalk projecting generally orthogonally from the substrate and surrounding the first stub. The second hollow stalk is generally coaxial with the first stalk and is spaced apart from the first stalk defining a radial gap therebetween. The first stub includes a cap section. The second stalk includes a stem projecting generally orthogonally, at a proximal end thereof, from the substrate. The second stalk has a first wall thickness and a first outer diameter at a distal end thereof. At least the outer diameter of the second stalk increases from the distal end toward the proximal end defining an engagement section. A flange section is defined between the engagement section and the stem. The flange section has an outer diameter greater than an outer diameter of the stem at a distal end thereof. At least first stub is fabricated from at least one of an electrically conductive material and a thermally conductive material. The first stub extends axially beyond the second stalk such that the base of the cap section is at least as distant from the substrate as the free end of the second stalk. The outer surface of the cap section may be generally conical, or generally hemispherical, or may have a generally convex contour.

BRIEF DESCRIPTION OF THE DRAWINGS

Understanding of the present invention will be facilitated by consideration of the following detailed description of the exemplary embodiments of the present invention taken in conjunction with the accompanying drawings, in which like numerals refer to like parts and in which.

DETAILED DESCRIPTION

It is to be understood that the figures and descriptions of the present invention have been simplified to illustrate elements that are relevant for a clear understanding of the present invention, while eliminating, for purposes of clarity, many other elements found in such reclosable fasteners and interconnecting surfaces. However, because such elements are well known in the art, and because they do not facilitate a better understanding of the present invention, a discussion of such elements is not provided herein. The disclosure herein is directed to all such variations and modifications known to those skilled in the art.

Figure 1A:
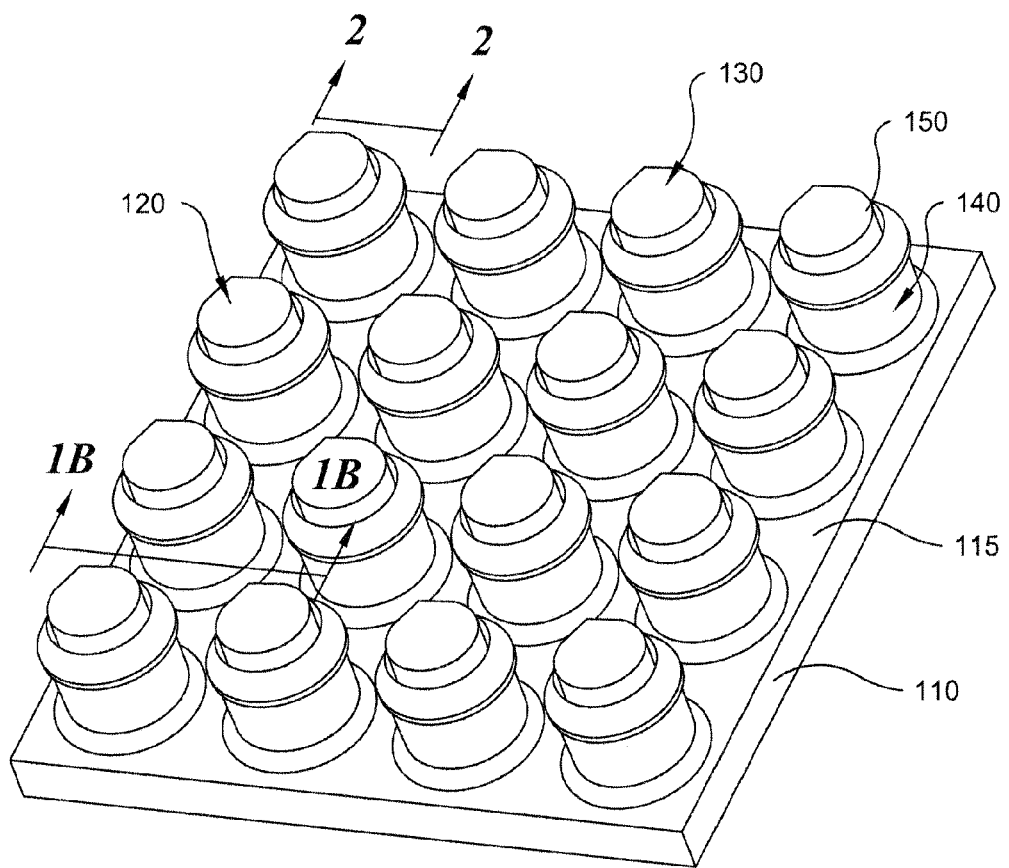
FIG. 1A illustrates an interconnecting body with a plurality of open stem connecting elements projecting from a surface thereof, according to an embodiment of the invention.
Figure 1B:
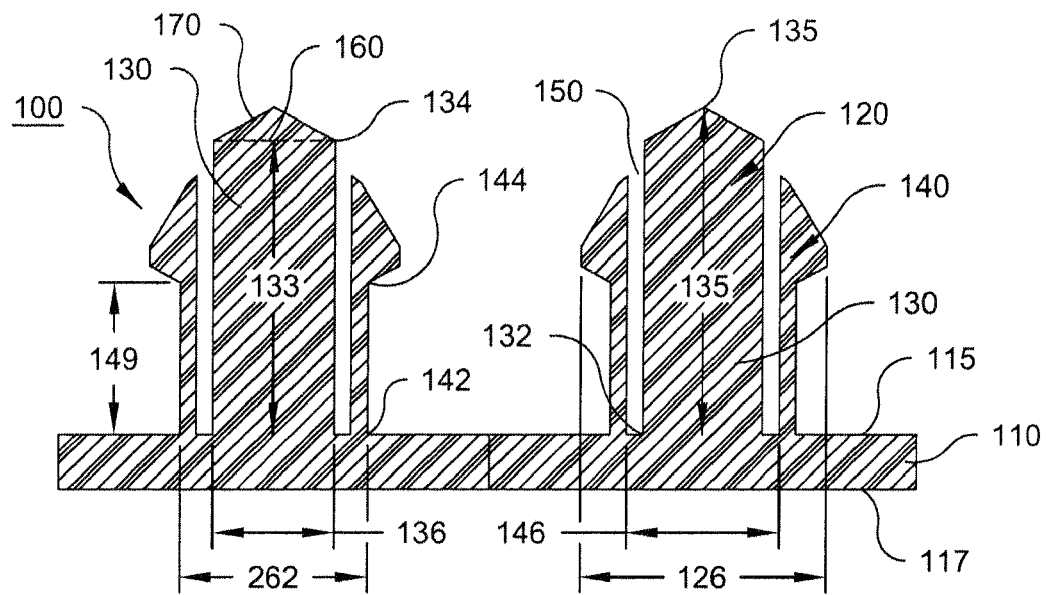
FIG. 1B is an elevational cross-section view of the interconnecting body of FIG. 1A, according to an embodiment of the invention.
Figure 1C:
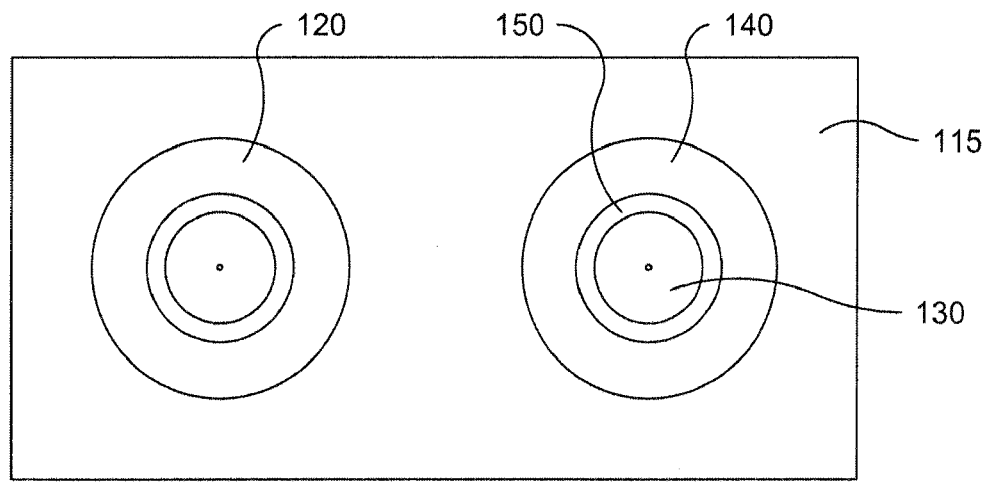
FIG. 1C is a plan view of the interconnecting body of FIG. 1A, according to an embodiment of the invention.
Figure 1D:
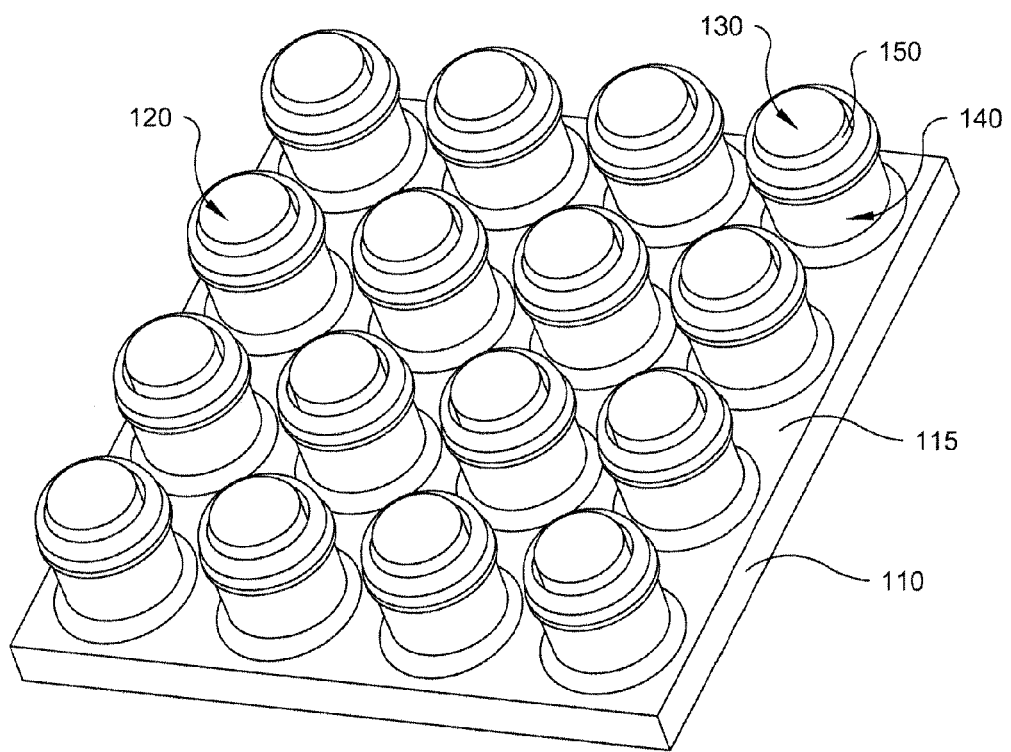
FIG. 1D illustrates an interconnecting body with a plurality of open stem connecting elements projecting from a surface thereof, according to another embodiment of the invention.

Referring to FIGS. 1A-1C, an article of manufacture or an interconnecting body 100 is illustrated, according to an embodiment of the invention. In the illustrated embodiment, body 100 includes a base 110 and a plurality of regularly spaced and uniformly dimensioned open stem connecting elements 120. Each of the connecting elements 120 is uniformly dimensioned and projects generally orthogonally from a first surface 115 of base 110. A second surface 117 of base 110 may be configured to be affixed or otherwise fastened to a component or a structure (not shown). In the illustrated embodiment, base 110 is a generally flat, planar substrate. In other embodiments, base 110 may take the form of a substrate having a curved profile. In yet other configurations, base 110 may take the form of an outer skin of one or more mechanical structures or electrical components such as circuit boards. FIG. 1D illustrates another embodiment of the interconnecting body 100.

In an exemplary embodiment, body 100 may be fabricated from engineering plastics using, for example, high tolerance injection molding processes, such as those currently in use for compact disc (CD) and Digital Video Disc (DVD) manufacture. Non-limiting examples of engineering plastics suitable for fabrication of body 100 include polycarbonates (PC), acrylonitrile butadiene styrene (ABS), polyamides (PA), polybutylene terephthalate (PBT), polyethylene terephthalate (PET), polyphenylene oxide (PPO), polysulpone (PSU), polyetherketone (PEK), polyetheretherketone (PEEK), polyimides and polyphenylene sulphide (PPS). Other suitable materials include materials having high heat resistance, mechanical strength, rigidity, chemical stability and flame retardancy.

In an exemplary embodiment, body 100 including connecting elements 120 may be fabricated from an electrically conductive material. In an exemplary embodiment, a non-conductive plastic body 100 may be surface coated with a nano-composite material such as a carbon nanotube composite or with metallic nano-spheres for imparting and electrical conductivity to the embodiment, after the fabrication of the open stem connecting elements. Since such coatings are known in the art, they are not described in detail for sake of brevity. In another embodiment, the connecting elements may be fabricated from an electrically conductive composite. Examples of electrically conductive composite include, but are not limited to, plastics that contain additives that impart such conductivity via inclusion of metallic powders, carbon black, carbon fibers, mats, and metalized glass fibers and spheres.

In another configuration, body 100 including connecting elements 120 may be fabricated from a thermally conductive material, for example, from carbon nanotube based composites. In another embodiment, the surface of body 100 or at least connecting elements 120 may be coated with a thermally conductive material such as a carbon nanotube composite or with metallic spheres.

Still referring to FIGS. 1A-1D, connecting element 120 includes a first generally cylindrical stub or stalk 130 and a second generally cylindrical stalk 140, both projecting generally orthogonally from surface 115. FIG. 1B illustrates a partial cross-section view of the embodiment of FIG. 1A along the line 1B-1B. In an exemplary embodiment, first stalk 130 is a solid stalk. In another embodiment, first stalk 130 may be a hollow stalk. In one configuration, second stalk 140 is a hollow stalk surrounding first stub or stalk 130 and is generally coaxial with first stalk 130. Second stalk 140 is spaced apart from first stalk 130 by a predetermined or fixed radial gap 150. First stalk 130 is coalesced, at a proximal end 132, to and extends from, surface 115 of base 110. Likewise, second stalk 140 is coalesced, at a proximal end 142, to and extends from, surface 115 of base 110. In an exemplary embodiment illustrated in FIGS. 1A-1C, first stalk 130 further includes a generally conical cap section 170 at a distal end 135 thereof. In another embodiment illustrated in FIG. 1D, first stalk 130 may include a generally hemispherical cap section 170. In yet another embodiment, the outer surface of cap section 170 may have a generally convex contour. Cap section 170 is coalesced to and extends from a base 160 at a second end 134 of first stalk 130. In the illustrated embodiment, first stalk 130 and second stalk 140 are each unitary, monolithic structures coalesced to and extending coaxially from base 110. In one configuration, first stalk 130 has a generally circular cross-section with a diameter 136 and a first height 138 and a second height 133. In the following description, height 133 of first stalk 130 refers to the distance between ends 132 and 134, whereas height 138 of first stalk 130 refers to the distance between ends 132 and 135. Cap section 170 has diameter 136 for base 160 and a height 172 (of FIG. 2).

In an exemplary embodiment, second stalk 140 has a generally circular cross-section with an inner diameter 146 and a generally uniform wall thickness 148 between ends 142, 144. In other embodiments, second stalk 140 may have a non-uniform wall thickness 148, depending on the requirements of a given application. For instance, second stalk 140 may have a first thickness at end 142 which tapers down or decreases toward end 144. Second stalk 140 is spaced apart from first stalk 130 defining a radial gap 150 therebetween. Radial gap 150 is defined by the difference in diameter 136 of first stalk 130 and inner diameter 146 of second stalk 140.

Figure 2:
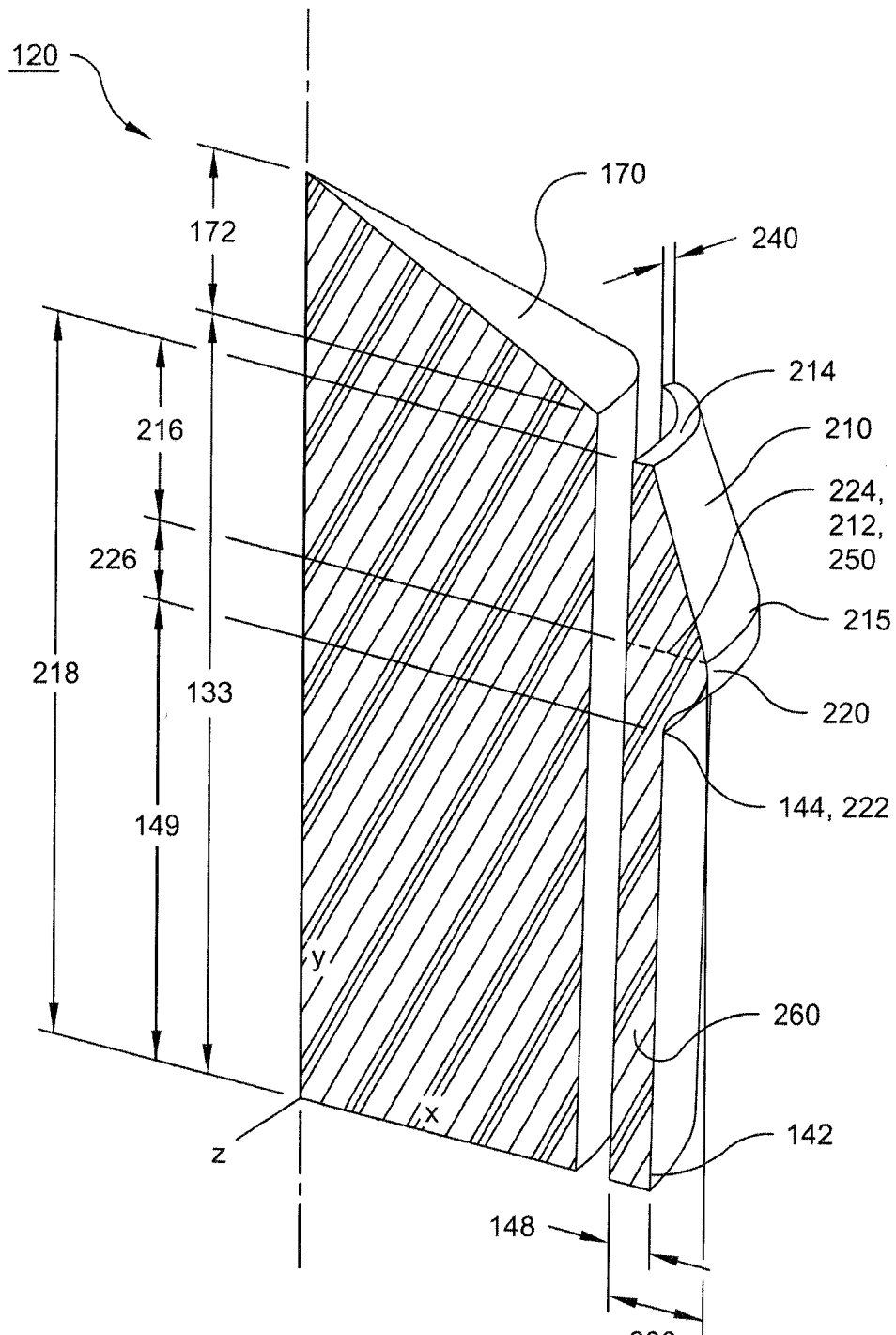
FIG. 2 is a perspective cross-sectional view of an open stem connecting element of the body of FIG. 1A, according to an embodiment of the invention.

Referring now to FIG. 2, a partial perspective cross-section view of an open stem connecting element is illustrated along lines 2-2 in FIG. 1A, according to an embodiment of the invention. Second stalk 140 includes a stem 260, a disengagement section 220, a flange section 215 and an engagement section 210, according to an embodiment of the invention. Disengagement section 220, flange section 215 and engagement section 210 form a unitary structure, however, are labeled and illustrated distinctly for only the ease of understanding. Stem 260 is coalesced to and extends from surface 115 and has a wall thickness 148. Stem 260 has a first end 142 and a second end 144 and has a height 149 which is the distance between ends 142, 144. At a first end 222, flange section 215 is coalesced to and extends from end 144 of stem 260. Disengagement section 220, defined between flange section 215 and stem 260, extends from first end 222 to a second end 224. At a first end 212, engagement section 210 is coalesced to and extends from second end 224 of disengagement section 220. Engagement section 210, thus, extends between first 212 and second end 214. Flange section 215, thus, defines a junction between engagement section 210 and disengagement section 220. Flange section 215 has an outer diameter 126, which is greater than an outer diameter 262 of stem 260 at distal end 144. Second stalk 140 has a height 218 which is the distance between ends 142 and 214.

Cap section 170 acts as an alignment mechanism for guiding a corresponding cap section (not shown) of a connecting element (not shown) projecting from a second body (not shown) superposed on body 100 toward a gap (not shown) defined by adjacent connecting elements 120. Engagement section 210 is configured to engage a corresponding engagement section (not shown) of the connecting element (not shown) projecting from the second body superposed on body 100 and, responsive to an engagement therebetween, provides a bending force urging second stalk 140 in a radial direction toward first stalk 130. Engagement section 210, thus, serves to bend second stalk 140 in a radial direction into radial gap 150, to facilitate the entry of the connecting element (not shown) into the gap (not shown) defined by adjacent connecting elements 120 by widening the gap (not shown). Engagement section 210, by providing the bending forces, also reduces the kinematic friction between the engaging connecting elements. Disengagement section or locking section 220 serves to engage a corresponding disengagement section 220 of the connecting element (not shown) extending from the second body (not shown) superposed on body 100 and provide a holding force resisting the movement of the connecting element (not shown) of the second interconnecting body (not shown) out of the gap defined by adjacent open stems 120, when the interconnecting bodies are subject to a disengaging force pulling at least one of them away from the other body.

Engagement section 210 has an inclined or tapered outer surface for engaging a corresponding engagement section (not shown) of the connecting element (not shown) projecting from the second body (not shown) superposed on body 100 (of FIG. 1). Engagement section 210 has a tapered cross-section having a first maximum thickness 230 at first end 212 and a second minimum thickness 240 at second end 214. The thickness of engagement section 210, thus, varies in a non-linear, continuously increasing fashion from second thickness 240 at second end 214 to first thickness 230 at first end 212. Thus, engagement section 210 has a first gradient defined from second end 214 to first end 212. The first gradient of engagement section 210 may be derived as the difference, between first thickness 230 and second thickness 240, divided by a length 216 of engagement section 210. In another exemplary embodiment, engagement section 210 may have a uniform or a non-uniform wall thickness between ends 212 and 214. However, engagement section 210 may have a first outer diameter at end 214 and a second outer diameter at end 212. The outer diameter of engagement section 210 may continuously increase from second outer diameter at end 212 to first outer diameter at end 214. Thus, first gradient of engagement section 210 may be derived as the difference, between second outer diameter at end 214 and first outer diameter at end 212, divided by length 216 of engagement section 210.

At a second end 224, disengagement section 220 is coalesced to and extends from first end 212 of engagement section 210 and, at a first end 222, coalesces into end 144 of stem 260. Disengagement section 220 has an inclined or tapered outer surface for engaging a corresponding disengagement section (not shown) of a connecting element (not shown) projecting from the second body (not shown) superposed on body 100 (of FIG. 1), when the connecting element (not shown) is lodged in the gap (not shown) defined by adjacent connecting elements 120. Disengagement section 220 has a tapered cross-section having a first maximum thickness 230 at second end 224 and a second minimum thickness 148 at first end 222. The thickness of disengagement section 220, thus, varies in a non-linear, continuously decreasing fashion from first thickness 230 at flange section 215 to second thickness 148 at first end 222. Thus, disengagement section 220 has a second gradient defined from first end 222 to second end 224. The second gradient of disengagement section 220 may be derived as the difference, between first thickness 230 and second thickness 147, divided by a length 226 of disengagement section 220. In an exemplary embodiment, the second taper of disengagement section 220 is greater than the first taper of engagement section 210. In another exemplary embodiment, disengagement section 220 may have a uniform or a non-uniform wall thickness between ends 222 and 224. However, disengagement section 220 may have a first outer diameter at end 224 and a second outer diameter at end 222. The outer diameter of disengagement section 220 may continuously decrease from first outer diameter at end 224 to second outer diameter at end 222. The decrease in the outer diameter of disengagement section 220 may be linear or non-linear. Thus, second gradient of disengagement section 220 may be derived as the difference, between first outer diameter at end 224 and second outer diameter at end 222, divided by length 216 of disengagement section 220.

Cap section 170 has a height 172 from base 160. In an exemplary embodiment, a height 133 of first stalk is greater than a height 218 of second stalk 140. Base 160 of cap section 170 is at least as distant as free end of second stalk 140 from surface 115.

In an exemplary embodiment, first stalk 130 may have diameter 136 of about 135 microns (μm), height 133 of about 390 μm and height 138 of about 450 μm, by way of non-limiting examples only. In one configuration first stalk 130 may have a ratio of diameter 136 to height 138 of about 3.33 and may range from about 2 to 5. Cap section 170 may have a height 172 about 40 μm. In one configuration, second stalk 140 may have inner diameter 146 of about 175 μm, a wall thickness 148 of about 20 μm, height 149 of about 185 μm, and height 218 of about 360 μm. Engagement section 210 may have height 216 of about 85 μm, second thickness 240 ranging from about 5 μm to about 10 μm and first thickness 230 of about 55 μm in an exemplary configuration. Disengagement section 220 may have height 226 of about 65 μm, first thickness 148 of about 20 μm and second thickness 230 of about 55 μm, in an exemplary embodiment. Radial gap 150 may be of about 22 μm, which may be slightly greater than thickness 148 of stem 260, in an exemplary configuration.

In an exemplary embodiment, engagement section 210 may have a first gradient of about 0.35 and disengagement section 220 may have a second gradient of about 0.8. In one configuration, the ratio of second gradient of disengagement section 220 to first gradient of engagement section 210 may range between about 2 to 6. The ratio of diameter 136 of first stalk 130 to wall thickness 148 of second stalk 140 may range from about 5 to about 8. The ratio of diameter 136 of first stalk 130 to radial gap 150 may range from about 5 to about 8. The ratio of wall height 149 of second stalk 140 to wall thickness 148 of second stalk 140 may range from about 8 to about 12. It will be understood that different dimensions and ratios may be selected for first stalk 130 and second stalk 140, depending on the requirements of a given application and that the exemplary values provided above are non-limiting in nature. One skilled in the art will further appreciate that the given dimensions may be scaled down to nanometer levels by a factor of about 1000 as well as scaled up to millimeter levels by a factor of about 1000 without departing from the scope of the invention.

Referring now to FIGS. 3A-3D, a system 300 including first and second interconnecting bodies 310, 410 configured to connect with each other is illustrated, according to an embodiment of the invention. Each of first and second interconnecting bodies 310, 410 has a corresponding first and second plurality of regularly spaced connecting elements 320, 420, of like dimensions, projecting generally orthogonally from respective first and second surfaces 315, 415. Each of the first and second pluralities of connecting elements 320, 420 is spaced apart from adjacent connecting elements by a predetermined distance D. Adjacent second stalks $140_a$, $140_b$ of respective adjacent connecting elements $420_a$, $420_b$ are separated by a minimum distance 430 about their respective flange sections 215 (of FIG. 2) and by a minimum distance 460 about their stems 260 (of FIG. 2). Each second stalk $140_a$, $140_b$ of connecting elements $420_a$, $420_b$ has an outer diameter 450 about flange section 215, as illustrated. Minimum distance 430 between two adjacent second stalks $140_a$, $140_b$ of respective adjacent connecting elements $420_a$, $420_b$ is smaller than outer diameter 450 of flange section 215, whereas minimum distance 460 between two adjacent stems 260 (of FIG. 2) of respective adjacent connecting elements $420_a$, $420_b$ is greater than outer diameter 450 of flange section 215.

In the illustrated embodiment, a sub-set $420_a$, $420_b$, $420_c$, $420_d$ of second plurality of connecting elements 420 of second body 410 define a central gap 425 therebetween to receive and accommodate a corresponding connecting element $320_a$ of first body 310. Likewise, a sub-set (not shown) of first plurality of connecting elements 320 of first body 310 define a central gap 325 (of FIG. 3A) therebetween to receive and accommodate a corresponding connecting element $420_a$ of second body 410.

First and second bodies 310, 410 are positioned such that cap sections 170 of first plurality of connecting elements 320 are in general contact engagement with cap sections 170 of second plurality of connecting elements 420. Upon application of an engagement force F on at least one of first and second bodies 310, 410, urging the at least one of first and second bodies 310, 410 toward the other, at least one of first plurality of connecting elements $320_a$ is received and accommodated by central gap 425 defined by sub-set $420_a$, $420_b$, $420_c$, $420_d$ of second plurality of connecting elements 420 and at least one of second plurality of connecting elements 420 is received and accommodated by the central gap (not shown) defined by a sub-set (not shown) of first plurality of connecting elements 320. Bodies 410, 310 may be interconnected with each other via first and second pluralities of connecting elements 420, 320, as described in detail below.

When first body 310 is superposed over second body 410, cap section 370 of connecting element $320_a$ and cap section 470 of connecting element $420_a$ are in general contact engagement with each other in a first stage of engagement. Cap sections 370, 470 by virtue of their generally conical or hemispherical shape act as alignment mechanism and guide connecting elements $420_a$, $320_a$ towards corresponding central gaps 425, 325. As a result, cap sections 370, 470 enter the corresponding central gaps 425, 325, wherein corresponding engagement sections 210 of connecting elements $420_a$, $320_a$ engage each other. As set forth above, minimum distance 430 between flange sections 215 of adjacent connecting elements $420_a$, $420_b$ is smaller than the outer diameter 450 of second stalk 140. Consequently, connecting elements $420_a$, $320_a$ encounter resistance to further progress of connecting elements $420_a$, $320_a$ into corresponding central gaps 325, 425.

However, a continuous application of engagement force F and the tapered complementary profiles of engagement sections 210 cause bending forces to be applied on stems 260 (of FIG. 2) of connecting elements $420_a$, $320_a$ pushing connecting elements $420_a$, $320_a$ radially inwardly. When engagement force F exceeds a first predetermined threshold, the bending forces are sufficient to temporarily expand central gaps 325, 425 to permit the entry of connecting element $420_a$, $320_a$ into corresponding central gap 325, 425.

Figure 3A:
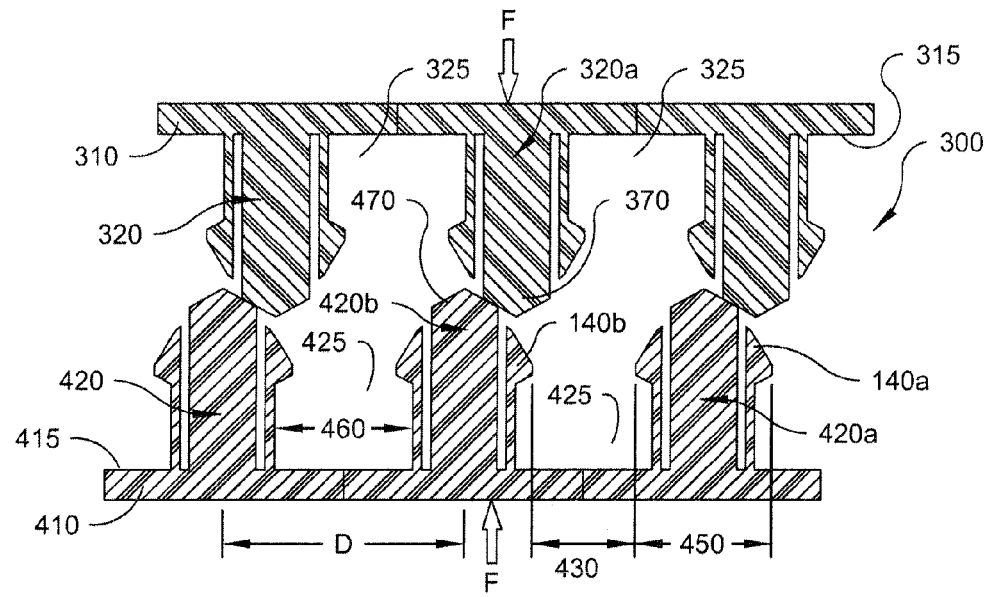
FIGS. 3A-3C illustrate various stages of an engagement process between two interconnecting bodies, each having a plurality of open stem connecting elements projecting from a surface thereof, according to an embodiment of the invention.
Figure 3B:
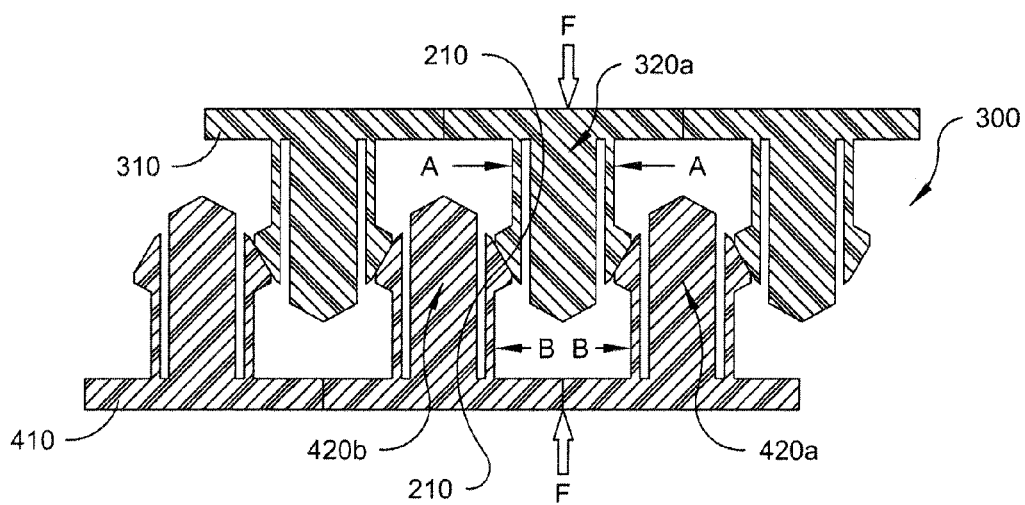
Figure 3C:
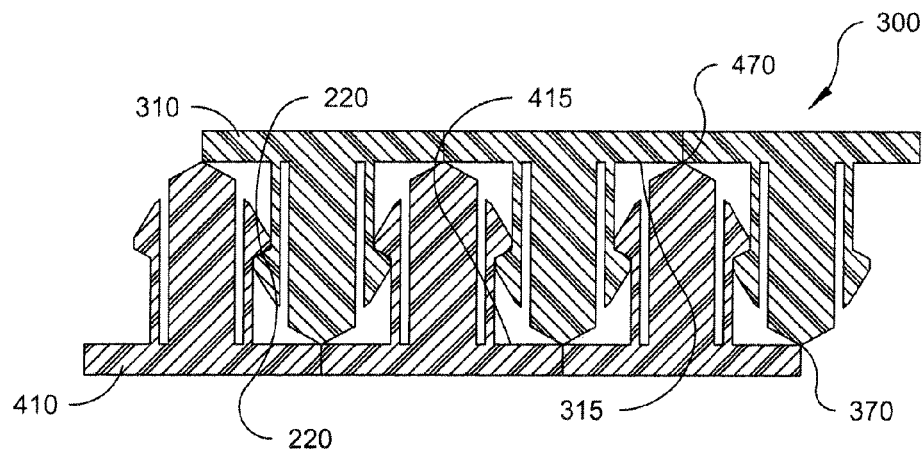

Given the relatively slender thickness 148 of stem 260 (of FIG. 1A) compared to height 149 (of FIG. 1A), engagement force F causes second stalk 140 (of FIG. 1A) of connecting element $320_a$ to be pushed radially inward toward first stalk 130 (of FIG. 1A) as shown by arrows A-A. Simultaneously, second stalks 140 (of FIG. 1A) of connecting elements $420_a$, $420_b$ are pushed radially inward toward respective first stalks 130 (of FIG. 1A) as shown by arrows B-B. Thus, minimum distance 430 between adjacent second stalks 140 of connecting elements $420_a$, $420_b$ temporarily increases sufficiently to permit the entry of connecting element $320_a$ into central gap 425. Finally, as the application of engagement force F is continued, cap section 470 contacts surface 315 and cap section 370 contacts surface 415, as illustrated in FIG. 3C. At this stage, disengagement sections 220 of connecting elements 320, 420 engage each other and lock connecting elements 320, 420 in corresponding central gaps 425, 325. First and second bodies 410, 310 are thus interconnected.

Figure 4:
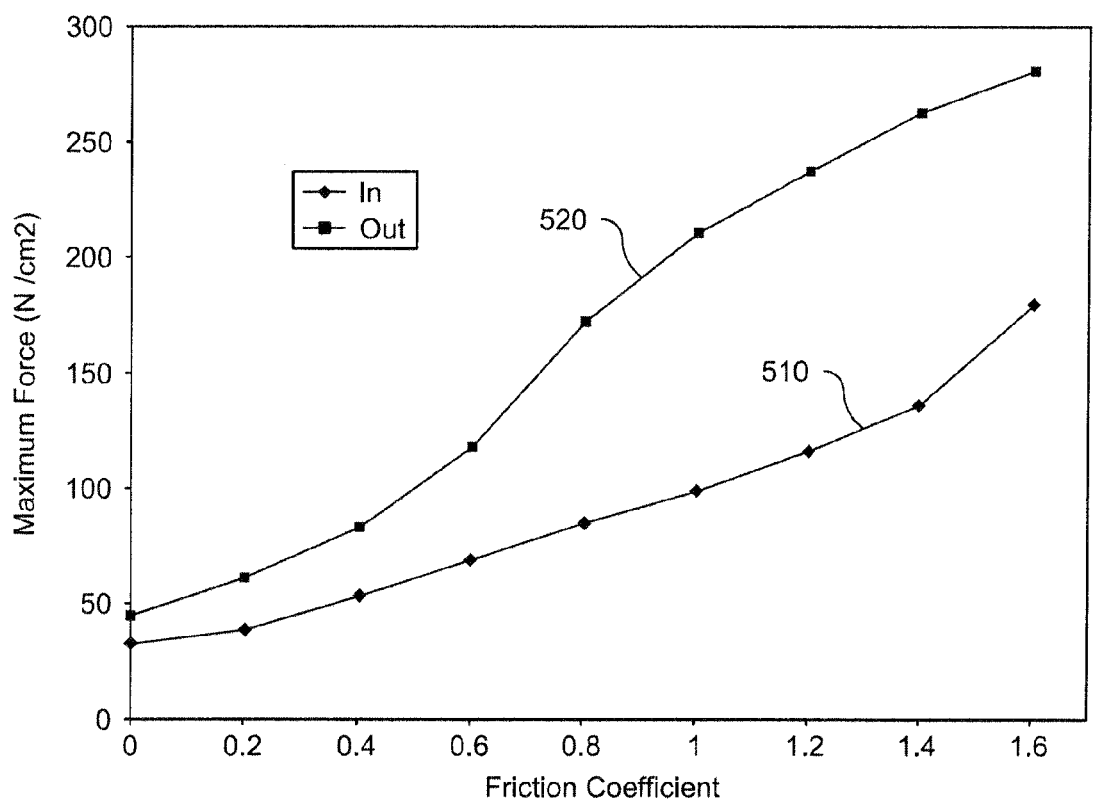
FIG. 4 is a chart illustrating variations in the engagement forces and the disengagement forces for the interconnecting bodies of FIGS. 3A-3C resulting from the variation in the coefficient of friction between the open stem connecting elements, according to an embodiment of the invention.
Figure 5:
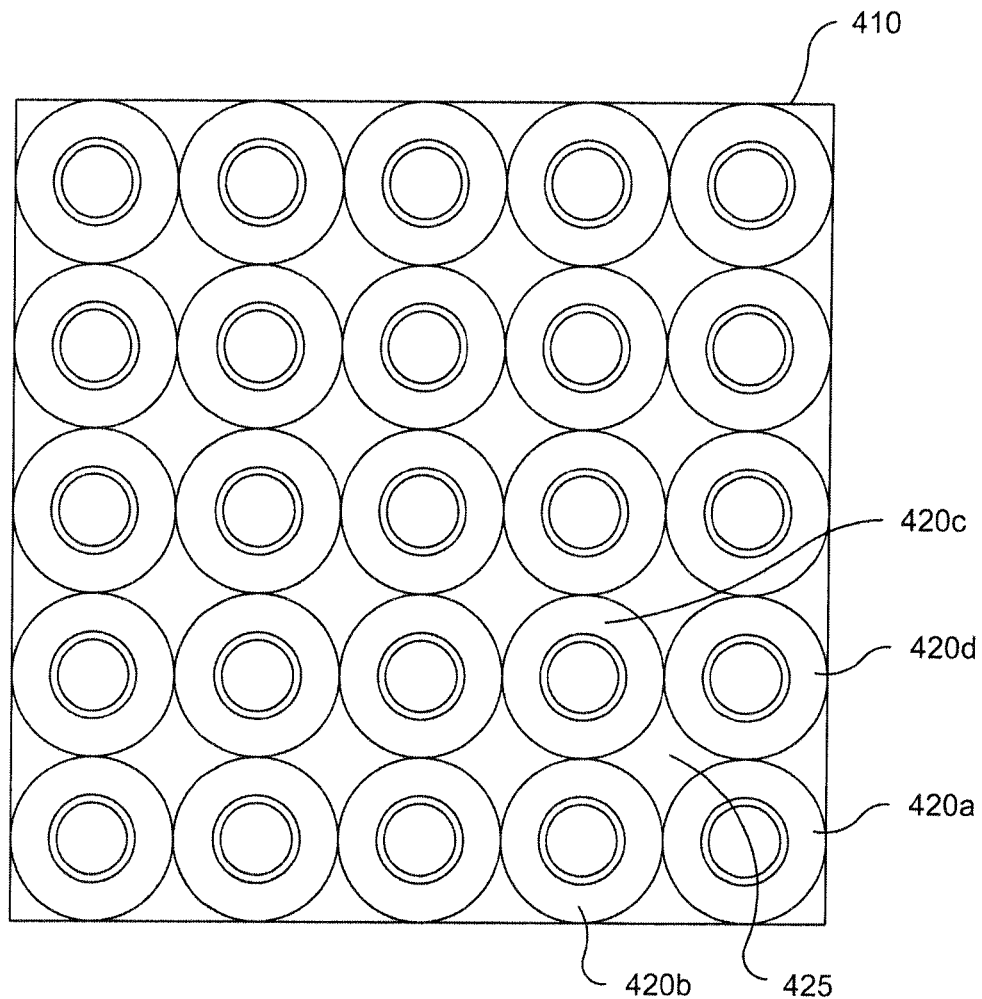
FIG. 5 is a schematic plan view of an interconnecting body with a plurality of connecting elements arranged in a square pattern, according to an embodiment of the invention.

Because the taper or second gradient of disengagement section 220 is relatively greater than the taper or first gradient of engagement section 210, a disengagement force required to pull connecting element $420_a$ out of central gap 325 in a direction opposite to that of the engagement force is greater than the engagement force required to insert connecting element $420_a$ into central gap 325. Referring now to FIG. 4, curves 510, 520 respectively illustrate the exemplary engagement forces and disengagement forces relative to an increase in the coefficient of friction between connecting elements 420, 320. Curve 510 illustrates the engagement forces increasing from about 40 Newton per square centimeter (N/cm$^2$) for a coefficient of friction of 0.0 to about 180 N/cm$^2$ for a coefficient of friction of about 1.6. Similarly, curve 520 illustrates the disengagement force increasing from about 45 N/cm$^2$ for a coefficient of friction of 0.0 to about 280 N/cm$^2$ for a coefficient of friction of 1.6. FIG. 5 further illustrates that interconnecting bodies 310, 410 are not subject to friction locking experienced by prior art solid stem interconnecting surfaces, as will be explained below.

Figure 3D:
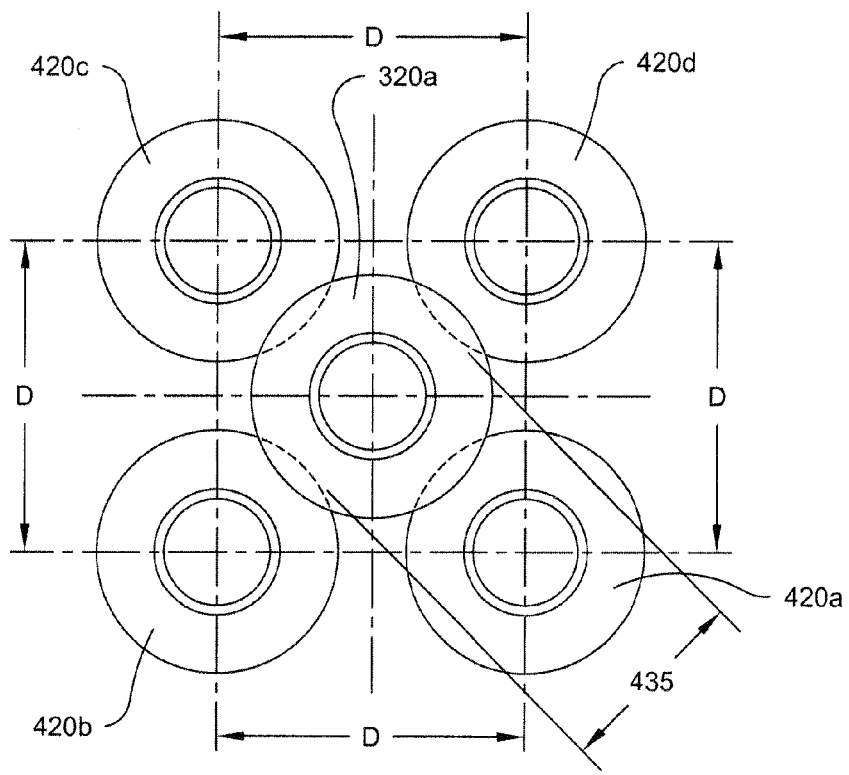
FIG. 3D shows a schematic plan view of four adjacent connecting elements of a first interconnecting body defining a gap for accommodating a corresponding connecting element projecting from a second interconnecting body, according to an embodiment of the invention.

Referring now to FIGS. 5 and 3D, connecting elements 420 are arranged in a square pattern as described below, in an embodiment of the invention. Any four adjacent connecting elements of the plurality of connecting elements 420, for instance, connecting elements $420_a$, $420_b$, $420_c$, $420_d$, which define a central gap 425 for receiving and accommodating connecting element $320_a$, define the vertices of a square. Thus, in a square pattern, each connecting element $320_a$ of surface 310 engages four connecting elements $420_a$, $420_b$, $420_c$, $420_d$ of second body 410. A first distance D between connecting elements $420_a$ and $420_b$ is equal to a second distance D between connecting elements $420_b$ and $420_c$, to a third distance D between connecting elements $420_c$ and $420_d$ and to a fourth distance D between connecting elements $420_a$ and $420_d$. A distance 435 between two diagonal stems $420_b$, $420_d$ has a value less than an outer diameter 126 of second stalk 140 and more than an outer diameter 262 of stem 260, i.e., inner diameter 146 plus two times wall thickness 148 of stem 260.

Figure 6A:
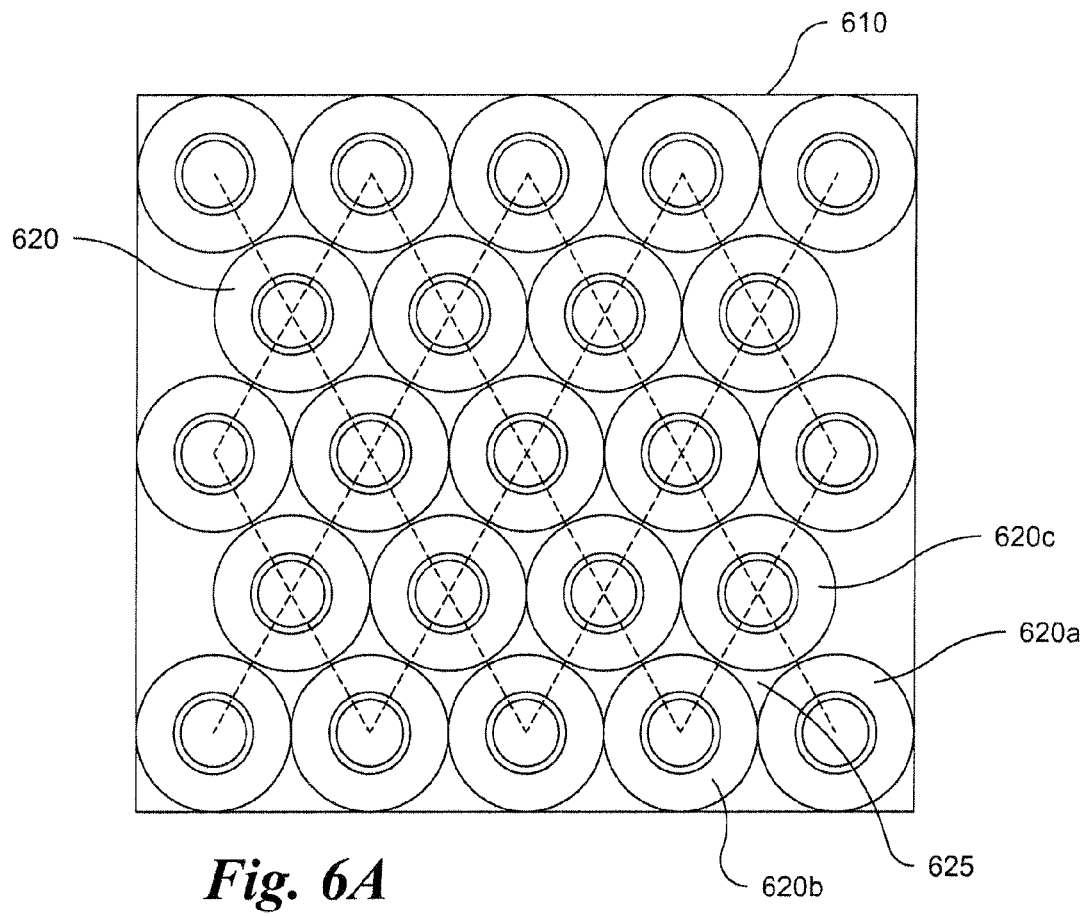
FIG. 6A is a schematic plan view of an interconnecting body with a plurality of connecting elements arranged in a triangle pattern, according to an embodiment of the invention.
Figure 6B:
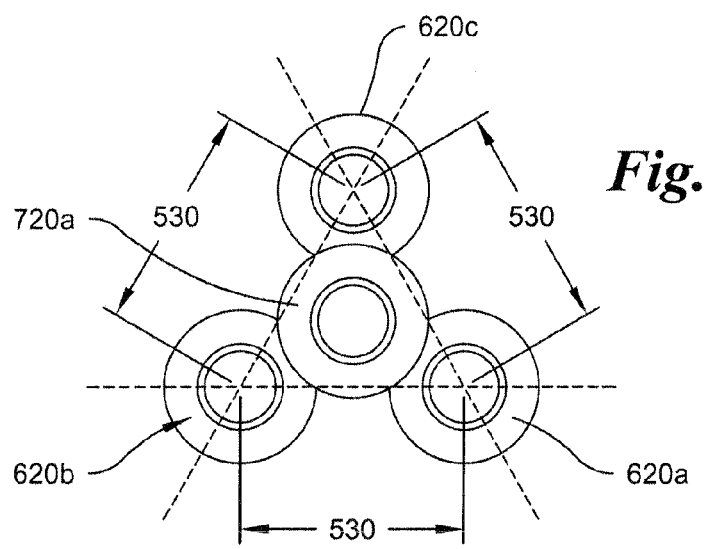
FIG. 6B is a schematic plan view of a sub-set of the plurality of connecting elements of FIG. 6A receiving a connecting element of a superposed interconnecting body, according to an embodiment of the invention.

Now referring to FIGS. 6A-6B, connecting elements $620_a$, $620_b$, $620_c$ of interconnecting body 610 are arranged in a triangle pattern as described below, according to another embodiment of the invention. Any three adjacent stems of the plurality of stems 620, for instance, connecting elements $620_a$, $620_b$, $620_c$, which define a central gap 625 for receiving and accommodating a connecting element $720_a$, define the vertices of an equilateral triangle. Central gap 625 receives and accommodates a connecting element $720_a$ of a superposed interconnecting body (not shown). Thus, in a triangle pattern, each connecting element $720_a$ of a body (not shown) engages three connecting elements $620_a$, $620_b$, $620_c$ of body 610. A first distance 530 between connecting elements $720_a$ and $720_b$ is equal to a second distance 530 between connecting elements $720_b$ and $720_c$ and to a third distance 530 between connecting elements $720_c$ and $720_a$.

In other embodiments, connecting elements 120 may be arranged in different patterns, such as pentagon, hexagon and other geometrical patterns, depending on the requirements of a given application. It will be appreciated that square and triangle patterns of connecting elements result in a tight pattern, i.e., higher density, as compared to other polygonal patterns.

Figure 7:
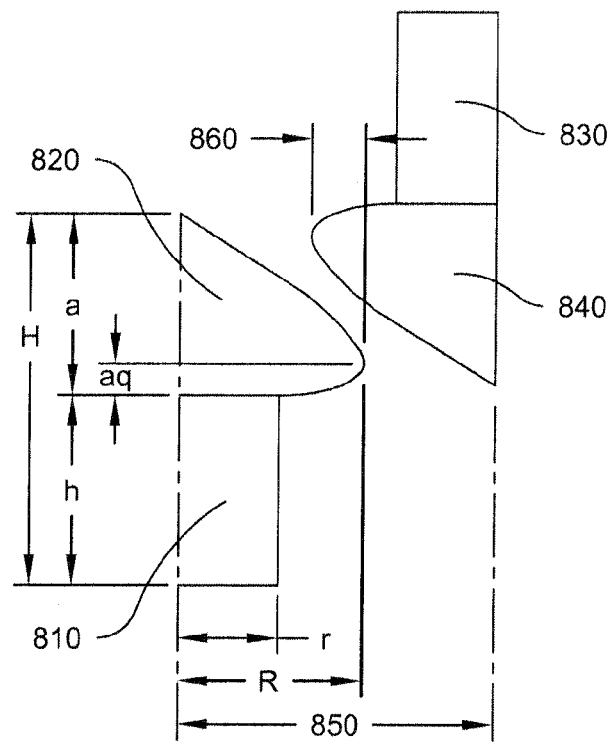
FIG. 7 is a schematic cross-sectional view of two conventional solid stems interacting with one another.

Referring now to FIG. 7, two conventional solid stems 810, 830 in prior art reclosable fastener surfaces are schematically illustrated. Stem 810 has a mushroom head 820 and stem 830 has a mushroom head 840. For a given radius R of mushroom heads 820, 840 and a given distance 850 between stems 810, 830, an overlap 860 is given by:

Overlap=2R−Distance between two stems.

Figure 8A:
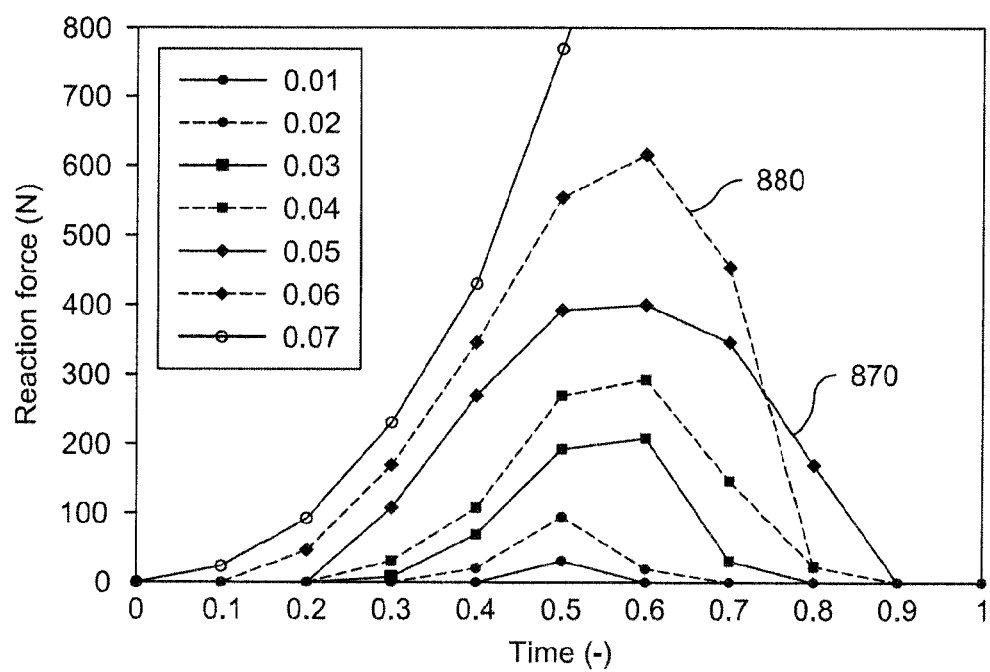
FIG. 8A is a chart illustrating the correlation of the engagement force and different values of overlap between the two solid stems of FIG. 7 for a constant value of the coefficient of friction.
Figure 8B:
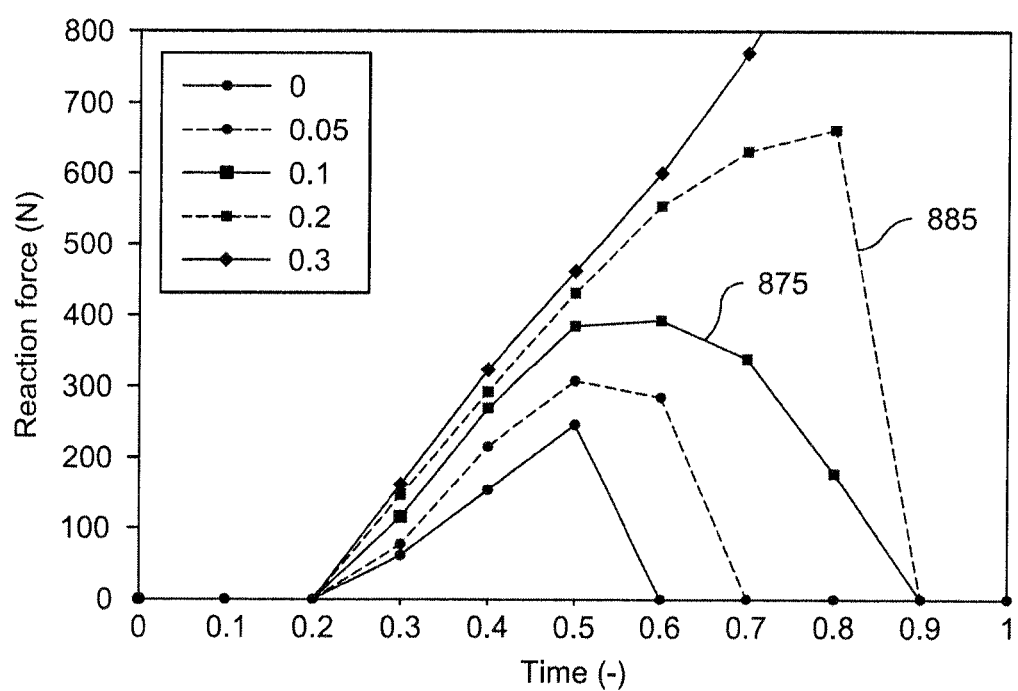
FIG. 8B is another chart illustrating the correlation of the engagement force and different values of coefficient of friction between the two solid stems of FIG. 7 for a constant value of the extent of the overlap between the two solid stems of FIG. 7.

FIGS. 8A, 8B illustrate the correlation between the engagement force, the extent of overlap of two mushroom heads and the coefficient of friction between the two mushroom heads. FIG. 8A illustrates the increase in engagement forces as the extent of overlap increases for a constant coefficient of friction 0.1. FIG. 8A further illustrates that for a coefficient of friction of 0.1, engagement is not possible when overlap is 0.06 times radius R of mushroom head 820, 840 due to friction locking between mushroom heads 820, 840. For instance, curve 870 illustrates the engagement force for an overlap of 0.05 times radius R and curve 880 illustrates the engagement force for an overlap of 0.06 times radius R. Likewise, FIG. 8B illustrates the increase in the engagement forces as the coefficient of friction increases for a constant overlap of 0.05 times radius R of mushroom heads 820, 840. FIG. 8B further illustrates that for a constant overlap of 0.05 times radius R, engagement is not possible when coefficient of friction exceeds 0.2 due to frictional locking between mushroom heads 820, 840. For example, curve 875 represents the engagement force for coefficient of friction of 0.1 whereas curve 885 represents the engagement force for coefficient of friction of 0.2. Thus, for conventional solid stems, friction locking may occur when any of the extent of overlap and the coefficient of friction of the stem material increases beyond a threshold.

An advantage of open stem connecting elements with two stalks is that the engagement and disengagement forces are independent of surface coefficient of friction between the connecting elements. Therefore, interconnecting bodies with open stem connecting elements are not subject to friction locking encountered in the known prior art interconnecting systems with solid stems under certain circumstances. Another advantage of the open stem connecting elements is that during engagement, entire second stalk is subjected to deformation. Such deformation of the entire second stalk keeps maximum strains in the second stalk within the material elastic limits. Yet another advantage of the open stem connecting elements with first and second stalks is that the engagement and disengagement forces may be controlled by changing the tapers or gradients of the engagement and disengagement sections.

Another advantage of the open stem connecting elements with first stalk is that the cap section of the first stalk provides self-aligning mechanism for the plurality of connecting elements. Yet further advantage of the generally conical or generally hemispherical cap section is that when first and second interconnecting bodies are superposed and engaged with each other, the cap sections are in contact with opposing surfaces. Such contact between the connecting elements and the opposing surfaces results in achieving and/or enhancing electrical and thermal conductivities between the interconnecting bodies. The disclosed open stem connecting elements separate the functionalities of the first and second stalk: the second stalk predominantly serves to provide mechanical locking between the two interconnecting surfaces, whereas the first stalk may serve as alignment mechanism as well as to provide one or more of thermal, electrical and optical conductivities between the two interconnecting bodies. As is known in the art, BGA technique requires heating of the BGA assembly to solder a BGA package to the circuit board having complementary copper pads. An advantage of the interconnecting open stem connecting elements is that the heating step is eliminated, making the assembly step simpler and cheaper. Yet another advantage of the disclosed open stem connecting elements is that two articles or substrates with such connecting elements may be engaged and disengaged multiple times without significant loss of tensile and shear holding forces. The use of hollow second stalk makes engagement and disengagement forces consistent and only weakly dependent on the coefficient of friction between the connecting elements.

According to an embodiment of the invention, first stalk of the connecting element may be used for optical conductivity between the two interconnecting bodies. Optical conductivity may be achieved by embedding graded index lenses, fiber optic waveguides, geometrically shaped lenses, axicons, and hollow-core waveguides into the first stalk. As such, the interconnect system may be utilized for electrical, optical, and a combination of electrical and optical connections therebetween.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An article of manufacture comprising:
    a plurality of regularly spaced connecting elements projecting from a surface of the article,
   wherein each connecting element of said plurality of connecting elements is uniformly dimensioned and comprises:
    a first stub projecting generally orthogonally from said surface; and
    a second hollow stalk projecting generally orthogonally from said surface and surrounding said first stub, said second stalk being generally coaxial with said first stub and spaced apart from said first stub and defining a radial gap therebetween;
        wherein said first stub comprises a cap section, and
        wherein said second stalk comprises:
    a stem projecting generally orthogonally, at a proximal end thereof, from said surface;
    a flange section extending from a distal end of said stem, said flange section having an outer diameter greater than an outer diameter of said stem at said distal end; and
    an engagement section extending from said flange section, wherein a free end of said engagement section defines a distal end of said second stalk, said free end of said engagement section having an outer diameter less than the outer diameter of said flange section,
   wherein said first stub extends axially beyond said second stalk, and wherein the base of said cap section is at least as distant from said surface as said free end of said second stalk.

2. The article according to claim 1, wherein said cap section is generally conical.

3. The article according to claim 1, wherein said cap section is generally hemispherical.

4. The article according to claim 1, wherein the wall thickness of said engagement section decreases continuously from said flange section to said free end.

5. The article according to claim 1, wherein the wall thickness of said flange section decreases continuously from said flange section to said distal end of said stem.

6. The article according to claim 1, wherein each of said plurality of connecting elements are uniformly dimensioned, and
    wherein a minimum distance between a first and a second flange section of a first and a second adjacent connecting element respectively of said plurality of connecting elements is less than the outer diameter of said first and second flange sections.

7. The article according to claim 1, wherein each of said plurality of connecting elements are uniformly dimensioned, and
    wherein a minimum distance between a stem of a first connecting element of said plurality of connecting elements and a stem of a second connecting element of said plurality of connecting elements is greater than the outer diameter of said flange sections of said first and second connecting elements.

8. The article according to claim 1, wherein said first stub comprises at least one of an electrical conductor, a thermal conductor, and an optical conductor.

9. The article according to claim 1, wherein an outer surface of said engagement section has a first gradient defined between said free end and said flange section, and an outer surface of said flange section has a second gradient defined between said flange section and said distal end of said stem, and wherein said second gradient is greater than said first gradient.

10. The article according to claim 1, a wall thickness of said stem at said distal end is greater than a wall thickness of said engagement section at said free end thereof.

11. The article according to claim 1, wherein said plurality of connecting elements is arranged in a square pattern, such that any four connecting elements of said plurality of connecting elements define the vertices of a square, such that a central gap is defined therebetween, said central gap being adapted to receive a corresponding connecting element projecting from a second article therein.

12. The article according to claim 1, wherein said plurality of connecting elements is arranged in a triangle pattern, such that any three connecting elements of said plurality of connecting elements define the vertices of a triangle, such that a central gap is defined therebetween, said central gap being adapted to receive a corresponding connecting element projecting from a second article therein.

13. A system comprising:
a first interconnecting article comprising a first plurality of regularly spaced connecting elements projecting from a first surface thereof; and
a second interconnecting article configured for connecting with said first interconnecting article and comprising a second plurality of regularly spaced connecting elements projecting from a second surface thereof,
wherein each connecting element of said first and second pluralities of connecting elements is uniformly dimensioned and comprises:
a first stub projecting generally orthogonally from one of said first and second surfaces; and
a second hollow stalk projecting generally orthogonally from said one of said first and second surfaces and surrounding said first stub, said second stalk being generally coaxial with said first stub and spaced apart from said first stub defining a radial gap therebetween;
wherein said first stub comprises a cap section, and wherein said second stalk comprises:
a stem projecting generally orthogonally, at a proximal end thereof, from the one of said first and second surfaces;
a flange section extending from a distal end of said stem, said flange section having an outer diameter greater than an outer diameter of said stem at said distal end; and
an engagement section extending from said flange section, wherein a free end of said engagement section defines a distal end of said second stalk, said free end of said engagement section having an outer diameter less than the outer diameter of said flange section,
wherein said first stub extends axially beyond said second stalk, and
wherein the base of said cap section is at least as distant from said surface as said free end of said second stalk, and
wherein when said second article is superposed on said first article such that said cap sections of said second plurality of connecting elements are in general contact engagement with said cap sections of said first plurality of connecting elements, a sub-set of connecting elements of said first plurality of connecting elements defines a central gap and accommodates a corresponding connecting element of said second plurality of connecting elements therein upon application of a first force greater than a first predetermined threshold on at least one of said first and second interconnecting articles, urging the at least one of said first and second interconnecting articles toward the other interconnecting article.

14. The system according to claim 13, when said connecting element of said second plurality of connecting elements is accommodated in said central gap, said cap section of said connecting element is in contact with said first surface.

15. The system according to claim 13, wherein, application of a second force greater than a second predetermined threshold on at least one of said first and second interconnecting articles in a direction opposite of said first force causes said connecting element of said second plurality of connecting elements to be released from said sub-set of said first plurality of connecting elements.

16. The system according to claim 13, wherein said second predetermined threshold is greater than said first predetermined threshold.

17. The system according to claim 13, wherein said first and second pluralities of connecting elements are arranged in a square pattern, such that any four connecting elements of any one of said first and second pluralities of connecting elements define the vertices of a square, such that said central gap is defined therebetween, said central gap being adapted to receive a corresponding connecting element projecting from the other of said first and second interconnecting articles therein.

18. The system according to claim 13, wherein said first and second pluralities of connecting elements are arranged in a triangle pattern, such that any three connecting elements of any one of said first and second pluralities of connecting elements define the vertices of a triangle, such that said central gap is defined therebetween, said central gap being adapted to receive a corresponding connecting element projecting from the other of said first and second interconnecting articles therein.

19. An electrical interconnect apparatus comprising:
a substrate; and
a plurality of regularly spaced connecting elements projecting from said substrate:
wherein each of said plurality of connecting elements comprises:
a first stub projecting generally orthogonally from said substrate; and
a second hollow stalk projecting generally orthogonally from said substrate and surrounding said first stub, said second stalk being generally coaxial with said first stub and spaced apart from said first stub defining a radial gap therebetween;
wherein said first stub comprises a cap section,
wherein said second stalk comprises a stem projecting generally orthogonally, at a proximal end thereof, from said substrate,
wherein said second stalk has a first wall thickness and a first outer diameter at a distal end thereof and wherein at least the outer diameter of said second stalk increases from said distal end toward said proximal end defining an engagement section, wherein a flange section is defined between said engagement section and said stem, said flange section having an outer diameter greater than an outer diameter of said stem at a distal end thereof, wherein at least first stub comprises at least one of an electrically conductive material and a thermally conductive material, wherein said first stub extends axially beyond said second stalk, and wherein the base of said cap section is at least as distant from said substrate as said distal end of said second stalk.

20. The apparatus according to claim 19, wherein the first wall thickness of said second stalk at said distal end is less than a wall thickness of said stem at said distal end.

21. The apparatus according to claim 19, wherein the outer surface of said cap section is generally conical or generally hemispherical or has a generally convex contour.

* * * * *